United States Patent
Kameyama et al.

(10) Patent No.: US 9,577,081 B2
(45) Date of Patent: Feb. 21, 2017

(54) SEMICONDUCTOR DEVICE AND METHOD FOR MANUFACTURING THE SAME

(71) Applicant: TOYOTA JIDOSHA KABUSHIKI KAISHA, Toyota-shi, Aichi-ken (JP)

(72) Inventors: Satoru Kameyama, Toyota (JP); Shinya Iwasaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/006,164

(22) Filed: Jan. 26, 2016

(65) Prior Publication Data

US 2016/0254374 A1 Sep. 1, 2016

(30) Foreign Application Priority Data

Feb. 27, 2015 (JP) ................................. 2015-037964

(51) Int. Cl.

| H01L 29/74 | (2006.01) |
|---|---|
| H01L 29/739 | (2006.01) |
| H01L 29/08 | (2006.01) |
| H01L 29/10 | (2006.01) |
| H01L 29/32 | (2006.01) |
| H01L 29/66 | (2006.01) |
| H01L 29/861 | (2006.01) |

(Continued)

(52) U.S. Cl.
CPC ......... *H01L 29/7397* (2013.01); *H01L 21/263* (2013.01); *H01L 21/26506* (2013.01); *H01L 29/0804* (2013.01); *H01L 29/0821* (2013.01); *H01L 29/1095* (2013.01); *H01L 29/32* (2013.01); *H01L 29/6609* (2013.01); *H01L 29/66348* (2013.01); *H01L 29/861* (2013.01)

(58) Field of Classification Search
CPC ............ H01L 29/7397; H01L 29/0804; H01L 29/0821; H01L 29/1095; H01L 29/32; H01L 29/6609; H01L 29/66348; H01L 29/861; H01L 21/26513; H01L 21/8234; H01L 27/0635
USPC ........................................................ 257/140
See application file for complete search history.

(56) References Cited

U.S. PATENT DOCUMENTS

| 2012/0043582 A1 | 2/2012 | Koyama et al. |
| 2013/0075783 A1* | 3/2013 | Yamazaki ............. H01L 21/263 257/139 |
| 2013/0260515 A1 | 10/2013 | Mizushima |

FOREIGN PATENT DOCUMENTS

| JP | 2008-172145 A | 7/2008 |
| JP | 2012-043891 A | 3/2012 |
| JP | 2013-197306 A | 9/2013 |

\* cited by examiner

*Primary Examiner* — Tu-Tu Ho
(74) *Attorney, Agent, or Firm* — Oliff PLC

(57) ABSTRACT

A semiconductor device includes a semiconductor substrate that includes an IGBT region. A first lifetime control layer extending along a planar direction of the semiconductor substrate is provided in a range in a drift region that is closer to the rear surface than an intermediate portion of the semiconductor substrate in a thickness direction. A crystal defect density in the first lifetime control layer is higher than any of a crystal defect density in a region adjacent to the first lifetime control layer on the rear surface side and a crystal defect density in a region adjacent to the first lifetime control layer on a front surface side. A crystal defect density in a region between the first lifetime control layer and the rear surface is lower than a crystal defect density in a region between the first lifetime control layer and the front surface.

9 Claims, 9 Drawing Sheets

(51) Int. Cl.
*H01L 21/263* (2006.01)
*H01L 21/265* (2006.01)

SEMICONDUCTOR DEVICE AND METHOD FOR MANUFACTURING THE SAME

CROSS-REFERENCE TO RELATED APPLICATION

This application claims priority to Japanese Patent Application No. 2015-037964 filed on Feb. 27, 2015, the entire contents of which are hereby incorporated by reference into the present application.

TECHNICAL FIELD

The technology disclosed herein relates to a semiconductor device and a method for manufacturing a semiconductor device.

DESCRIPTION OF RELATED ART

Japanese Patent Application Publication No, 2012-43891 A discloses a semiconductor device including an IGBT (Insulated Gate Bipolar Transistor) region. A lifetime control layer in which a crystal defect density is high is provided in a part of a drift region in the IGBT region. The lifetime control layer is formed in a range in the drift region that is closer to a rear surface than an intermediate portion of the semiconductor substrate in a thickness direction (i.e., in a range that is located near a collector region) of the semiconductor substrate. Such formation of the lifetime control layer in the range in the drift region that is located near the collector region makes it possible to cause carriers in the drift region to annihilate in a short time during a turn-off time of the IGBT. For this reason, the IGBT of this semiconductor device has a small turn-off loss.

SUMMARY

It has been found that the mass production of semiconductor devices by the technology disclosed in Japanese Patent Application Publication No. 2012-43891 A results in great variations in on-state voltages of the IGBTs among the semiconductor devices thus mass-produced. Therefore, the present disclosure provides a structure of a semiconductor device which includes a lifetime control layer and in which, during mass production, variations are less likely to occur in on-state voltages of the IGBTs, and a method for manufacturing such a semiconductor device.

The lifetime control layer disclosed in Japanese Patent Application Publication No. 2012-43891 A is formed by implanting charged particles into the semiconductor substrate from a rear surface side (collector region side) of the semiconductor substrate. For this reason, a crystal defect density is high entirely in a region closer to the rear surface than the lifetime control layer. That is, a crystal defect density in the collector region is high. The on-state voltage of the IGBT is greatly affected by the quantity of holes that flow from the collector region into the drift region when the IGBT is turned on. When crystal defects are formed at a high density in the collector region as in the technology disclosed in Japanese Patent Application Publication No. 2012-43891 A, variations in crystal defect density causes variations in easiness for holes to flaw from the collector region into the drift region. For this reason, there are great variations in the on-state voltages of the IGBTs among semiconductor devices that are mass-produced.

A semiconductor device disclosed herein comprises a semiconductor substrate that includes an IGBT region. The semiconductor substrate includes a front surface and a rear surface. The IGBT region comprises an emitter region, a body region, a drift region, and a collector region. The emitter region is of n-type and exposed on the front surface. The body region is of p-type and in contact with the emitter region. The drift region is of n-type, located on a rear surface side with respect to the body region, and separated from the emitter region by the body region. The collector region is of p-type, located on the rear surface side with respect to the drift region, separated from the body region by the drift region, and exposed on the rear surface. A gate electrode is located so as to face, via a gate insulating film, a part of the body region in a range separating the emitter region from the drift region. A first lifetime control layer extending along a planar direction of the semiconductor substrate is provided in a range in the drift region that is closer to the rear surface than an intermediate portion of the semiconductor substrate in a thickness direction of the semiconductor substrate. A crystal defect density in the first lifetime control layer is higher than any of a crystal defect density in a region adjacent to the first lifetime control layer on the rear surface side and a crystal defect density in a region adjacent to the first lifetime control layer on a front surface side. A crystal defect density in a region between the first lifetime control layer and the rear surface is lower than a crystal defect density in a region between the first lifetime control layer and the front surface.

It should be noted that the rear surface of the semiconductor substrate means a surface of the semiconductor device opposite to the front surface. Further, the planar direction means a direction orthogonal to the thickness direction of the semiconductor substrate (i.e., a direction parallel to the front or rear surface of the semiconductor substrate).

In this semiconductor device, a crystal defect density in a region between the first lifetime control layer and the rear surface of the semiconductor substrate is lower than a crystal defect density in a region between the first lifetime control layer and the front surface of the semiconductor substrate. This structure can be achieved by implanting charged particles into a position of the first lifetime control layer from the front surface side of the semiconductor substrate. In this semiconductor device, variations in crystal defect density within the collector region are less likely to occur, as a crystal defect density in a range in the collector region that is closer to the rear surface than the first lifetime control layer is low. Therefore, variations in the ease with which holes flow from the collector region into the drift, region are less likely to occur. For this reason, during the mass production of semiconductor devices of this structure, variations in the on-state voltages of the IGBTs among the semiconductor devices are less likely to occur.

Another aspect of the present disclosure provides a method for manufacturing a semiconductor device, the method comprising forming a first lifetime control layer, processing a front surface side, and processing a rear surface side. The forming of the first lifetime control layer includes implanting charged particles into a semiconductor substrate comprising an n-type drift region so as to form the first lifetime control layer in the n-type drift region, wherein the semiconductor substrate includes a front surface and a rear surface, the charged particles are implanted from a front surface side, and a crystal defect density is increased in the first lifetime control layer. The processing of the front surface side includes forming an emitter region, a body region, and a gate electrode in a range closer to the front surface than the first lifetime control layer. The processing of the rear surface side includes forming a collector region in a range closer to the rear surface than the first lifetime control layer. The emitter region is of n-type and exposed on the front surface. The body region is of p-type, is in contact with the emitter region, and separates the emitter region from the drift region. The gate electrode faces, via a gate insulating film, a part of the body region in a range separating the emitter region from the drift region. The collector region is of p-type, located on a rear surface side with respect to the drift region, separated from the body region by the drift region, and exposed on the rear surface. The first lifetime control layer is located in a range closer to the rear surface than an intermediate portion of the semiconductor substrate in a thickness direction of the semiconductor substrate.

It should be noted that the formation of the first lifetime control layer, the processing of the front surface side, and the processing of the rear surface side may be executed in any order. Further, a part of the processing of the front surface side may be executed first, and the remaining part of the processing of the front surface side may be executed after another step (i.e., either or both of the formation of the first lifetime control layer and the processing of the rear surface side). Further, a mutual relationship between the emitter region, the body region, the drift region, the collector region, the gate electrode, and the first lifetime control layer needs only to be achieved at a stage of completion of the semiconductor device, and such a relationship does not necessarily need to be achieved in a middle of the manufacturing process. Further, the emitter region and the body region may be formed by ion implantation or epitaxial growth. Further, in the formation of the first lifetime control layer, the first lifetime control layer may be formed in the range closer to the rear surface than the intermediate portion of the semiconductor substrate in the thickness direction. Alternatively, in the formation of the first lifetime control layer, the first lifetime control layer may be formed in a range closer to the front surface than the intermediate portion of the semiconductor substrate in the thickness direction, and thereafter, the rear surface of the semiconductor substrate may be polished, so that that the first lifetime control layer may be positioned in the range closer to the rear surface than the intermediate portion of the semiconductor substrate in the thickness direction.

This manufacturing method includes implanting charged particles into the semiconductor substrate from the front surface side. Such implantation of charged particles causes crystal defects to be formed at a highest density at a position where the charged particles stop, thus causing the first lifetime control layer to be formed. After completion of the semiconductor device, the first lifetime control layer is positioned in the range closer to the rear surface than the intermediate portion of the semiconductor substrate in the thickness direction. Further, crystal defects are also formed in a region between the first lifetime control layer and the front surface of the semiconductor substrate (i.e., a region through which the charged particles pass), albeit at a lower density than in the first lifetime control layer. For this reason, a crystal defect density is higher in the region closer to the front surface than the first lifetime control layer than in the region closer to the rear surface. This manufacturing method includes forming the emitter region, the body region, and the gate electrode in the region closer to the front surface of the semiconductor substrate and forming the collector region in the region closer to the rear surface. That is, the collector region is formed in a region in which a crystal defect density is low. For this reason, this manufacturing method makes it possible to suppress variations in the on-state voltages of the IGBTs among semiconductor devices that are manufactured. In this way, in this manufacturing method, charged particles are implanted into the semiconductor substrate from the front surface side so as to form the first lifetime control layer. That is, this manufacturing method does not include a step of implanting charged particles (i.e., charged particles for forming crystal defects) from the rear surface side into a range in the semiconductor substrate in which the collector region is formed. This makes it possible to lower the crystal defect density in the collector region, thus making it possible to suppress variations in the on-state voltages of the IGBTs.

DETAILED DESCRIPTION

Figure 1:
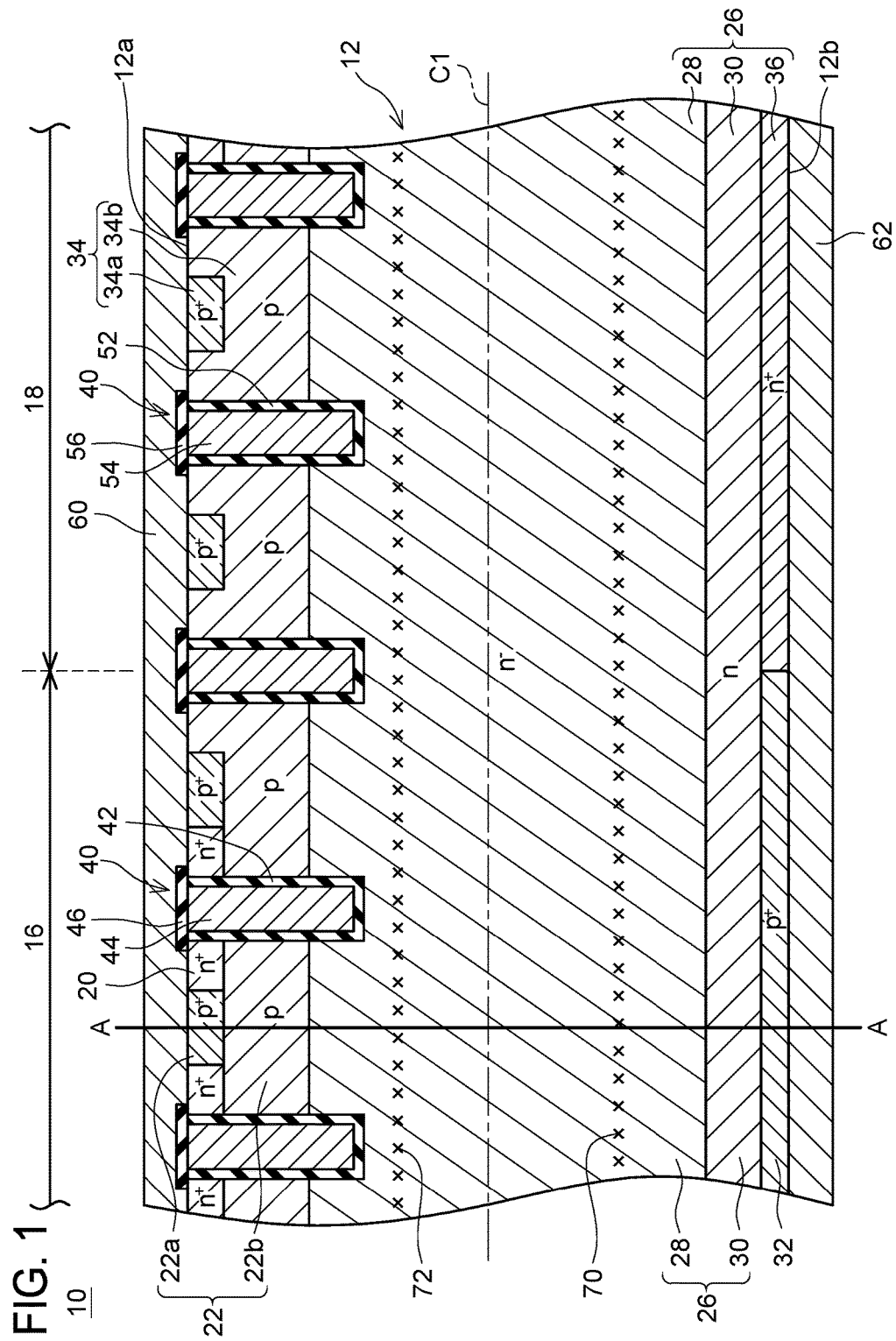
FIG. 1 is a longitudinal sectional view of a semiconductor device 10.

FIG. 1 shows a semiconductor device 10 that is manufactured by a method according to the present embodiment. The semiconductor device 10 includes a semiconductor substrate 12 and electrodes, insulators, and the like formed on a front surface 12 and a rear surface 12b of the semiconductor substrate 12. The semiconductor substrate 12 includes an IGBT region 16 in which an IGBT is formed and a diode region 18 in which a diode is formed. That is, the semiconductor device 10 is a so-called RC-IGBT.

The semiconductor substrate 12 is made of silicon. A plurality of trenches 40 is formed in the front surface 12a of the semiconductor substrate 12. The trenches 40 extend parallel to each other along a direction perpendicular to a paper plane of FIG. 1.

An inner surface of each trench 40 in the IGBT region 16 is covered with a gate insulating film 42. A gate electrode 44 is provided in an inner part of each trench 40 in the IGBT region 16. The gate electrode 44 is insulated from the semiconductor substrate 12 by the corresponding gate insulating film 42. A front surface of the gate electrode 44 is covered with an interlayer insulating film 46.

An inner surface of each trench 40 in the diode region 18 is covered with an insulating film 52. A control electrode 54 is provided in an inner part of each trench 40 in the diode region 18. The control electrode 54 is insulated from the semiconductor substrate 12 by the corresponding insulating film 52. A front surface of the control electrode 54 is covered with an interlayer insulating film 56. A potential of the control electrode 54 is controlled independently of a potential of the gate electrode 44.

An upper electrode 60 is arranged on the front surface 12a of the semiconductor substrate 12. The upper electrode 60 is insulated from the gate electrode 44 by the interlayer insulating film 46 and insulated from the control electrode 54 by the interlayer insulating film 56. A lower electrode 62 is arranged on the rear surface 12b of the semiconductor substrate 12.

In an inner part of the IGBT region 16, emitter regions 20, a body region 22, a drift region 26, and a collector region 32 are arranged.

Each emitter region 20 is an n-type region. The emitter region 20 is exposed on the front surface 12a of the semiconductor substrate 12. The emitter region 20 is in ohmic contact with the upper electrode 60. The emitter region 20 is in contact with the corresponding gate insulating film 42.

The body region 22 includes body contact regions 22a and a low-density body region 22b. Each body contact region 22a is a p-type region that contains a high density of p-type impurities. The body contact regions 22a are exposed on the front surface 12a of the semiconductor substrate 12. Each body contact region 22a is adjacent to the corresponding emitter region 20. The body contact region 22a is in ohmic contact with the upper electrode 60. The low-density body region 22b is a p-type region that has a lower density of p-type impurities than the body contact regions 22a do. The low-density body region 22b is arranged below the emitter region 20 and the body contact region 22a. The low-density body region 22b is in contact with the gate insulating films 42 below the emitter region 20.

The drift region 26 includes a low-density drift region 28 and a buffer region 30. The low-density drift region 28 is an n-type region that contains a lower density of n-type impurities than the emitter regions 20 and the buffer region 30 do. The low-density drift region 28 is arranged below the low-density body region 22b. The low-density drift region 28 is separated from the emitter regions 20 by the low-density body region 22b. The low-density drift region 28, provided below the low-density body region 22b, is in contact with a part of the gate insulating film 42 at bottom ends of the trenches 40. The buffer region 30 is an n-type region that contains a higher density of n-type impurities than the low-density drift region 28 does. The density of n-type impurities in the buffer region 30 is ten or more times higher than the density of n-type impurities in the low-density drill region 28. The buffer region 30 is arranged below the low-density drift region 28.

The collector region 32 is a p-type region that contains a high density of p-type impurities. The collector region 32 is formed below the buffer region 30. The collector region 32 is exposed on the rear surface 12b of the semiconductor substrate 12. The collector region 32 is in ohmic contact with the lower electrode 62.

In the IGBT region 16, an IGBT connected between the upper electrode 60 and the lower electrode 62 is formed by the emitter regions 20, the body region 22, the drift region 26, the collector region 32, the gate electrodes 44, and the like. In a case where the semiconductor device 10 operates as an IGBT, the upper electrode 60 serves as an emitter electrode and the lower electrode 62 serves as a collector electrode.

In an inner part of the diode region 18, anode regions 34 and the aforementioned drift region 26 are provided.

The anode region 34 includes an anode contact region 34a and a low-density anode region 34b. The anode contact region 34a is a p-type region that contains a high density of p-type impurities. The anode contact region 34a is exposed on the front surface 12a of the semiconductor substrate 12. The anode contact region 34a is in ohmic contact with the upper electrode 60. The low-density anode region 34b is a p-type region that has a lower density of p-type impurities than the anode contact region 34a does. The low-density anode region 34b is formed around the anode contact region 34a. The low-density anode region 34b is in contact with the insulating films 52.

A part of the drift region 26 in the diode region 18 includes the aforementioned low-density drift region 28, the aforementioned buffer region 30, and a cathode region 36. A part of the low-density drift region 28 in the diode region 18 is linked to a part of the low-density drift region 28 in the IGBT region 16. The part of the low-density drift region 28 in the diode region 18 is arranged below the low-density anode region 34b, and is in contact with a part of the insulating films 52 near the bottom ends of the trenches 40. A part of the buffer region 30 in the diode region 18 is linked to a part of the buffer region 30 in the IGBT region 16. In the diode region 18, too, the buffer region 30 is arranged below the low-density drift region 28. The cathode region 36 is an n-type region that contains a higher density of n-type impurities than the buffer region 30 does. The cathode region 36 is arranged below the buffer region 30. The cathode region 36 is adjacent to the collector region 32. The cathode region 36 is exposed on the rear surface 12b of the semiconductor substrate 12. The cathode region 36 is in ohmic contact with the lower electrode 62.

In the diode region 18, a p-n diode connected between the upper electrode 60 and the lower electrode 62 is formed by the anode region 34, the drift region 26, and the like. In a case where the semiconductor device 10 operates as a diode, the upper electrode 60 serves as an anode electrode and the lower electrode 62 serves as a cathode electrode. That is, the diode is connected in antiparallel to the IGBT.

In the low-density drift region 28, a first lifetime control layer 70 and a second lifetime control layer 72 are provided.

The first lifetime control layer 70 is a semiconductor layer that is higher in crystal defect density than semiconductor layers adjacent to top and bottom portions of the first lifetime control layer 70. The first lifetime control layer 70 extends in a form of a layer along a planar direction two directions orthogonal to a thickness direction) of the semiconductor substrate 12. The first lifetime control layer 70 extends across the IGBT region 16 and the diode region 18. In a planar view of the front surface 12a of the semiconductor substrate 12, the first lifetime control layer 70 is arranged along an entirety of the IGBT region 16 and the diode region 18. The first lifetime control layer 70 is arranged in a range that is closer to the rear surface 12b than an intermediate portion C1 of the semiconductor substrate 12 relative to the thickness direction. That is, the first lifetime control layer 70 is arranged in a range in the low-density drift region 28 that is located near the buffer region 30.

The second lifetime control layer 72 is a semiconductor layer that is higher in crystal defect density than semiconductor layers adjacent to top and bottom portions of the second lifetime control layer 72. The second lifetime control layer 72 extends in a form of a layer along the planar direction of the semiconductor substrate 12. The second lifetime control layer 72 extends across the IGBT region 16 and the diode region 18. In the planar view of the front surface 12a of the semiconductor substrate 12, the second lifetime control layer 72 is arranged along the entirety of the IGBT region 16 and the diode region 18. The second lifetime control layer 72 is arranged in a range that is closer to the front surface 12a than the intermediate portion C1 of the semiconductor substrate 12 relative to the thickness direction. That is, the second lifetime control layer 72 is arranged in a range in the low-density drift region 28 that is located near the bottom ends of the trenches 40.

Figure 2:
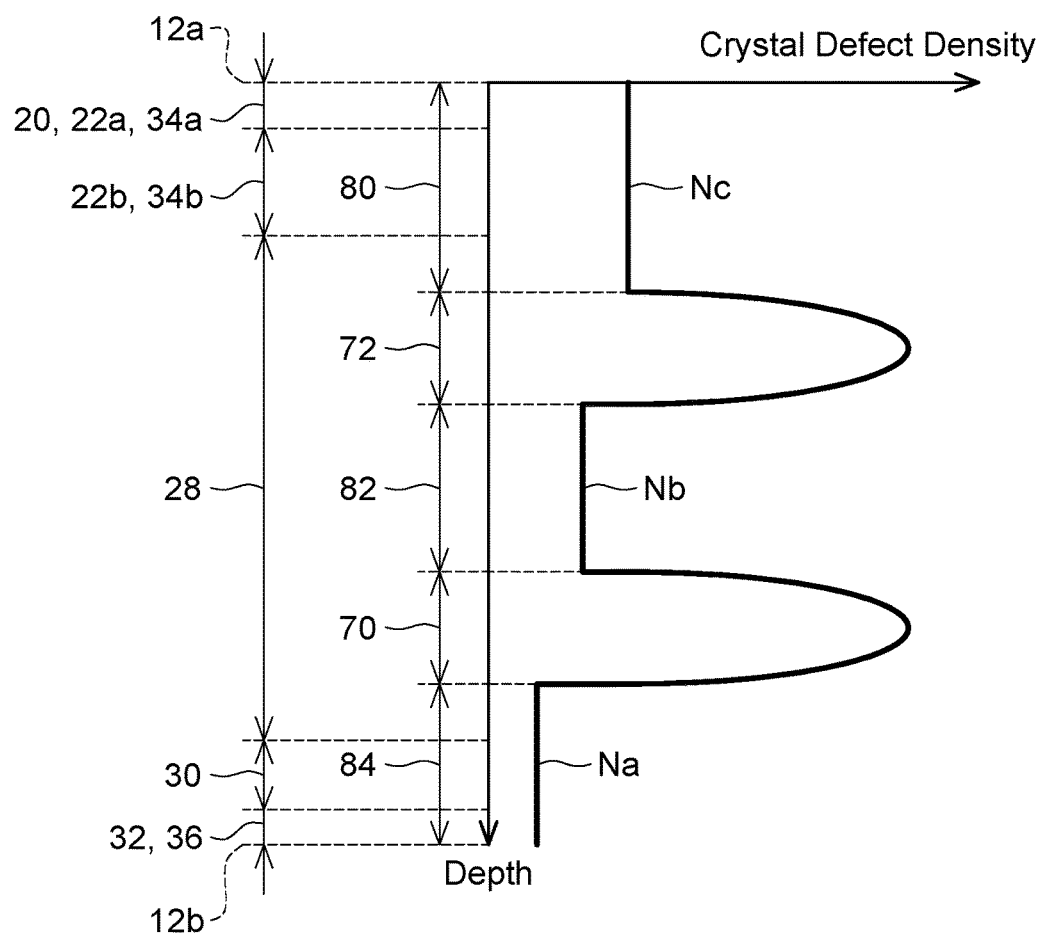
FIG. 2 is a graph showing a distribution of crystal defect densities at a position of line A-A of FIG. 1.

FIG. 2 shows a distribution of crystal defect densities in the semiconductor substrate 12 at a position indicated by line A-A in FIG. 1. That is, FIG. 2 shows a distribution of crystal defect densities in the thickness direction of the semiconductor substrate 12. It should be noted that although FIG. 1 shows the line A-A in the IGBT region 16, crystal defects are also distributed in the diode region 18 in a manner which is similar to that shown in FIG. 2.

As shown in FIG. 2, crystal defect densities in the first lifetime control layer 70 and the second lifetime control layer 72 are distributed in the form of Gaussian distribution. In a semiconductor layer 84 below the first lifetime control layer 70 (i.e. a semiconductor layer 84 including the buffer region 30, the collector region 32, and the cathode region 36), crystal defects are distributed at a substantially constant density Na. In a semiconductor layer 82 located between the first lifetime control layer 70 and the second lifetime control layer 72, crystal defects are distributed at a substantially constant density Nb. A crystal defect density in the first lifetime control layer 70 is higher than any of the crystal defect densities Na and Nb. Further, the crystal defect density Nb is higher than the crystal defect density Na. In a semiconductor layer 80 above the second lifetime control layer 72 (i.e. a semiconductor layer 80 including the emitter regions 20, the body region 22, and the anode region 34), crystal defects are distributed at a substantially constant density Nc. A crystal defect density in the second lifetime control layer 72 is higher than any of the crystal defect densities Nb and Nc. Further, the crystal defect density Nc is higher than the crystal defect density Nb. It should be noted that either the crystal defect density in the first lifetime control layer 70 or the crystal defect density in the second lifetime control layer 72 may be higher than the other.

As is evident from these descriptions, the crystal defect density Na in the semiconductor layer 84 below the first lifetime control layer 70 is lower than the crystal defect densities in the semiconductor layers 82, 72, and 80 above the first lifetime control layer 70. More specifically, the crystal defect density Na in the semiconductor layer 84 is lower than any of the crystal defect density Nb in the semiconductor layer 82, the crystal defect density in the second lifetime control layer 72, and the crystal defect density Nc in the semiconductor layer 80.

The following will describe how the semiconductor device 10 operates. First, how the IGBT operates will be described. The IGBT is turned on when a higher potential is applied to the lower electrode 62 than that applied to the upper electrode 60 and a gate voltage equal to or higher than a threshold value is applied to the gate electrodes 44. That is, the application of the gate voltage causes a channel to be formed in a range in the low-density body region 22b that is adjacent to the gate insulating films 42. For this reason, electrons flow from the upper electrode 60 into the low-density drift region 28 through the emitter regions 20 and the channel. Further, holes flow from the lower electrode 62 into the low-density drift region 28 through the collector region 32 and the buffer region 30. Then, densities of electrons and holes in the low-density drift region 28 are heightened, and a conductivity modulation phenomenon causes the low-density drift region 28 to be extremely low in electric resistance. Due to this reason, electrons and holes pass through the low-density drift region 28 with low loss. The electrons flow from the low-density drift region 28 to the lower electrode 62 through the buffer region 30 and the collector region 32. Since the electrons are high in mobility, the electrons flow to the lower electrode 62 in a short time. The holes flow from the low-density drift region 28 to the upper electrode 60 through the low-density body region 22b and the body contact region 22a. Since the holes are low in mobility, the holes stay in the low-density drift region 28 for a longer time than the electrons do. That is, while the IGBT is on, a predetermined quantity of holes is accumulated in the low-density drift region 28. Note here that the on-state voltage of the IGBT depends greatly on the quantity of holes that are accumulated in the drift region 26 (in particular, the low-density drift region 28) while the IGBT is on. The quantity of holes that are accumulated in the drift region 26 depends greatly on the quantity of holes that flow from the lower electrode 62 into the low-density drift region 28. The quantity of holes that flow from the lower electrode 62 into the low-density drift region 28 depends greatly on the density of p-type impurities in the collector region 32, the density of n-type impurities in the buffer region 30, and the crystal defect density in the collector region 32 and the buffer region 30. That is, the on-state voltage of the IGBT depends greatly on three factors: the density of p-type impurities in the collector region 32, the density of n-type impurities in the buffer region 30, and the crystal defect density in the collector region 32 and the buffer region 30. In the present embodiment, the crystal defect density Na in the collector region 32 and the buffer region 30 is significantly low. For this reason, the crystal defect density in the collector region 32 and the buffer region 30 does not stand as a main factor for variations in the on-state voltages. The on-state voltage of the IGBT depends virtually on two factors: the density of p-type impurities in the collector region 32 and the density of n-type impurities in the buffer region 30. Therefore, when these semiconductor devices 10 are mass-produced, variations in the on-state voltages of the IGBTs among the semiconductor devices 10 are less likely to occur.

It should be noted, as mentioned above, that while the IGBT is on, holes stay in the low-density drift region 28 for a longer time than electrons do, whereas electrons pass through the low-density drift region 28 in a short time. For this reason, the electric resistance of the low-density drift region 28 while the IGBT is on is determined by the quantity of holes that flow from the lower electrode 62 into the low-density drift region 28, and is hardly affected by the quantity of electrons that flow from the upper electrode 60 into the low-density drift region 28. That is, the on-state voltage of the IGBT is hardly affected by the quantity of electrons that flow from the upper electrode 60 into the low-density drift region 28. In the semiconductor device 10, the crystal defect density Nc in the emitter regions 20 and the body region 22 (i.e., a pathway through which electrons flow from the upper electrode 60 into the low-density drift region 28) is higher than the crystal defect density Na in the collector region 32 and the buffer region 30. However, as mentioned above, the quantity of electrons that flow into the low-density drift region 28 hardly affects the on-state voltage. Therefore, even when the crystal defect density Nc in the emitter regions 20 and the body region 22 is comparatively high, the on-state voltage is hardly affected. That is, even when the crystal defect density Nc in the emitter regions 20 and the body region 22 is comparatively high, this does not lead to great variation in on-state voltages.

Lowering the potential of the gate electrodes 44 while the IGBT is on causes the channel to disappear, and thus the IGBT is turned off. At this occasion, the holes accumulated in the low-density drift region 28 are discharged into the upper electrode 60 through the low-density body region 22b and the body contact region 22a. This flow of a current attributed to holes generates a loss when the IGBT is turned off. In this semiconductor device 10, however, the first lifetime control layer 70 and the second lifetime control layer 72, in which the crystal defect densities are high, are arranged in parts of the low-density drift region 28 in the IGBT region 16. Crystal defects function as recombination centers for holes and electrons. For this reason, when the IGBT is turned off, most of the holes in the low-density drift region 28 become extinct due to recombination in the first lifetime control layer 70 and the second lifetime control layer 72. This suppresses a current attributed to holes during the turn-off time of the IGBT, thus reducing a turn-off loss. In this IGBT, in particular, since the first lifetime control layer 70 is arranged in a range in the low-density drift region 28 that is close to the buffer region 30, more holes can be recombined in the first lifetime control layer 70 during the turn-off time. Therefore, the IGBT has extremely small turn-off loss.

Further, as noted above, the current flowing during the turn-off time of the IGBT is generated when the holes accumulated in the low-density drift region 28 while the IGBT is on are discharged into the upper electrode 60. Therefore, the current flowing during the turn-off time of the IGBT depends greatly on the quantity of holes that are accumulated in the drift region 26 while the IGBT is on. As mentioned above, in the semiconductor device 10, variations in the quantity of holes that are accumulated in the drift region 26 while the IGBT is on are less likely to occur, as the crystal defect density in the buffer region 30 and the collector region 32 of the IGBT is low. For this reason, variations in magnitude of the current flowing during the turn-off time of the IGBT are less likely to occur. That is, when these semiconductor devices 10 are mass-produced, variations in turn-off loss of the IGBTs among the semiconductor devices 10 are less likely to occur.

The following will describe how the diode operates. The diode is turned on by applying a voltage that makes the upper electrode 60 higher in potential than the lower electrode 62. Then, a current flows from the upper electrode 60 to the lower electrode 62 through the anode contact region 34a, the low-density anode region 34b, the low-density drift region 28, the buffer region 30, and the cathode region 36. Thereafter, changing the voltage between the lower electrode 62 and the upper electrode 60 to a backward voltage causes the diode to perform a reverse recovery operation. That is, holes accumulated in a part of the low-density drift region 28 in the diode region 18 are discharged into the upper electrode 60 through the low-density anode region 34b and the anode contact region 34a. This causes a reverse recovery current to flow through the diode to cause a loss. In this semiconductor device 10, however, the first lifetime control layer 70 and the second lifetime control layer 72, in which the crystal defect densities are high, are formed in parts of the low-density drift region 28 in the diode region 18. When the diode performs a reverse recovery operation, most of the holes in the low-density drift region 28 annihilate due to recombination in the first lifetime control layer 70 and the second lifetime control layer 72. This suppresses the flow of holes i.e., a reverse recovery current) during the reverse recovery operation of the diode, thus reducing a loss. In this diode, in particular, since the second lifetime control layer 72 is arranged in a range in the low-density drift region 28 that is close to the body region 22, more holes can be recombined in the second lifetime control layer 72 during the reverse recovery operation. Therefore, loss caused during the reverse recovery operation of the diode is small.

Figure 3:
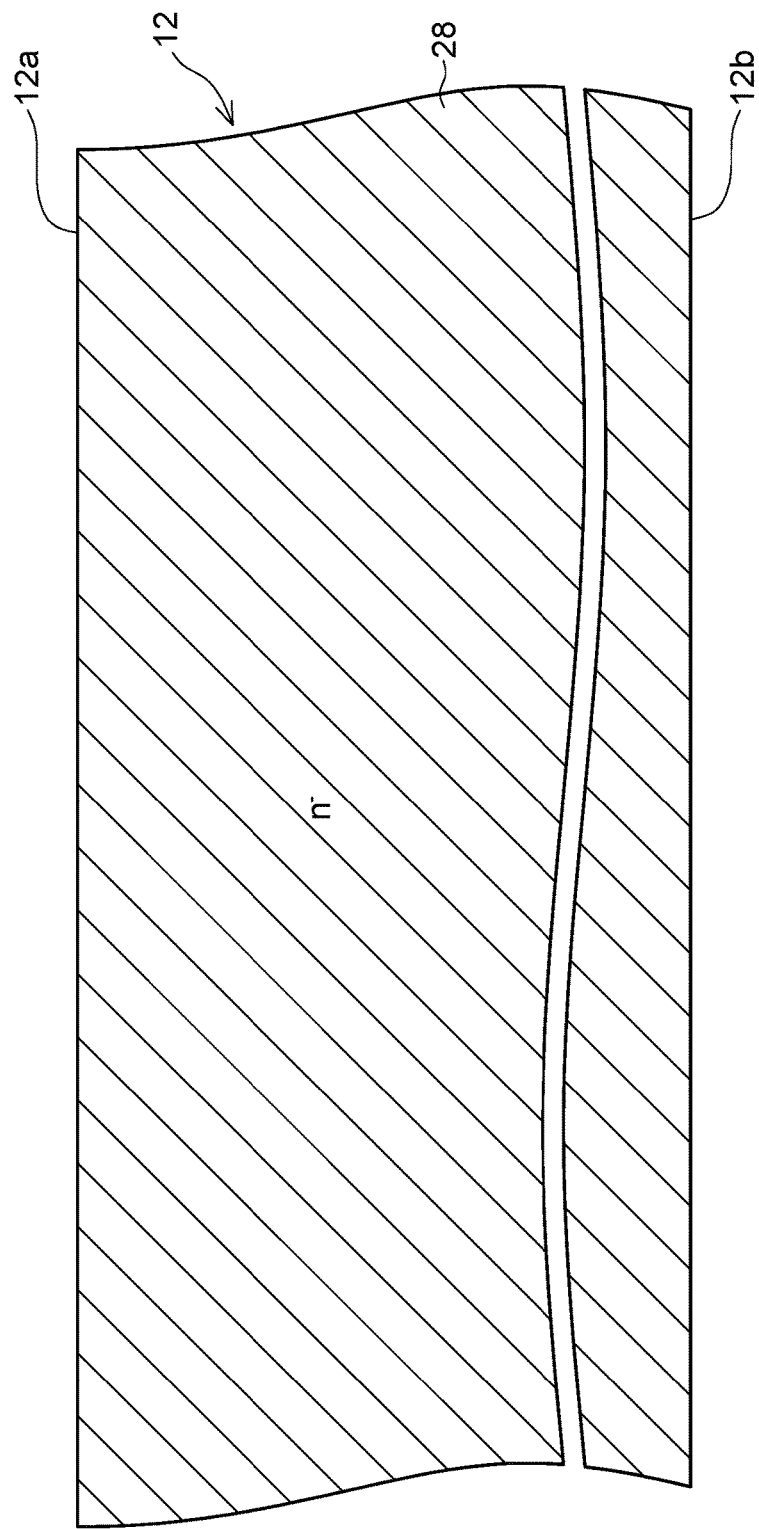
FIG. 3 is a longitudinal sectional view of a semiconductor substrate 12 before processing.

The following will describe a method for manufacturing the semiconductor device 10. A semiconductor device 10 is manufactured from an unprocessed semiconductor substrate 12 shown in FIG. 3. The unprocessed semiconductor substrate 12 has in its entirety substantially the same density of n-type impurities as the low-density drift region 28. Further, the unprocessed semiconductor substrate 12 is greater in thickness than the semiconductor substrate 12 shown in FIG. 1.

Trench Formation Process

Figure 4:
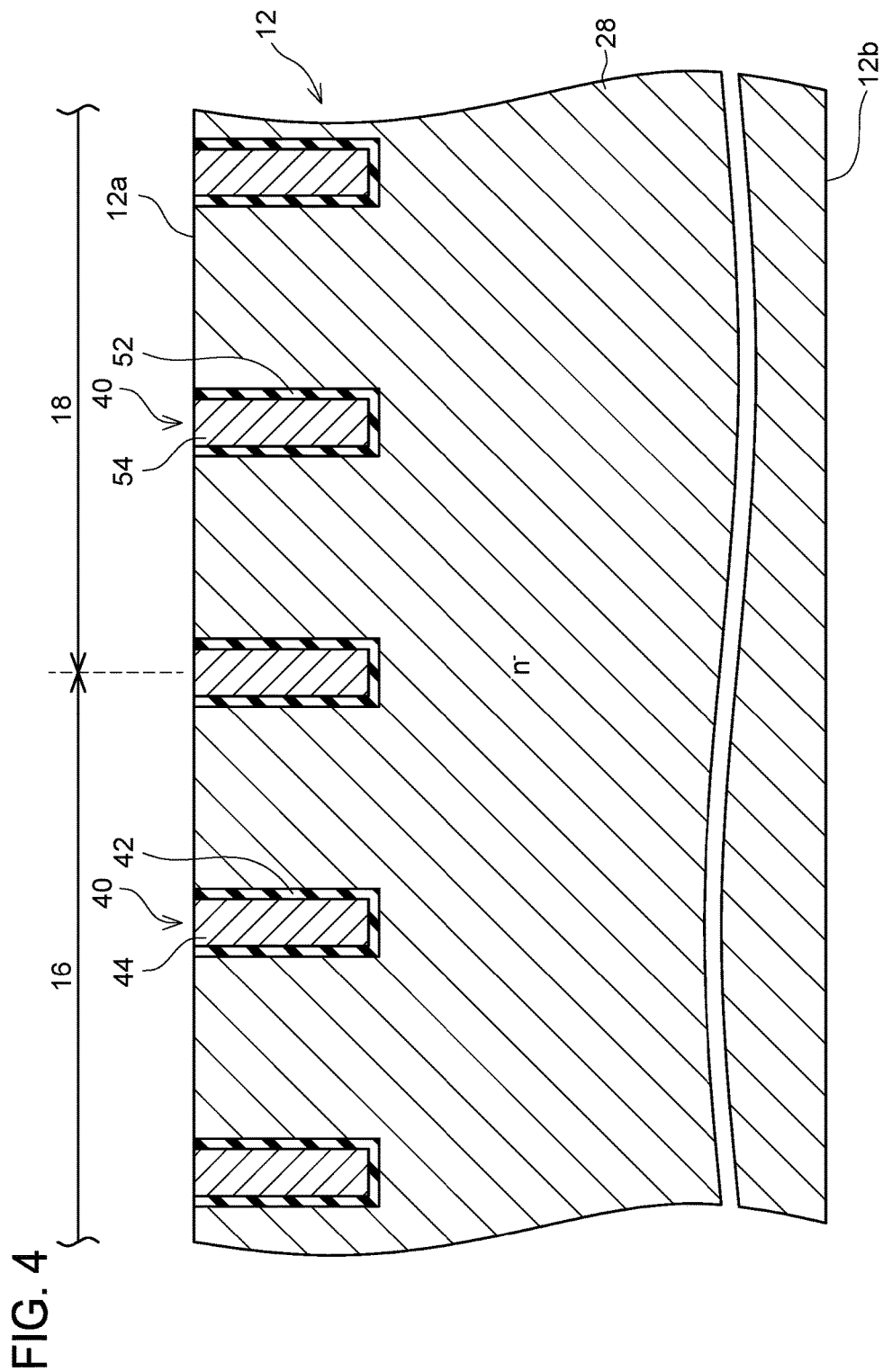
FIG. 4 is a longitudinal sectional view of the semiconductor substrate 12 in which gate electrodes 44 have been formed.

First, as shown in FIG. 4, trenches 40 are formed by selectively etching the front surface 12a of the semiconductor substrate 12. Next, a gate insulating film 42 and an insulating film 52 are formed so as to cover an inner surface of each of the trenches 40. Next, a gate electrode 44 and a control electrode 54 are formed in each of the trenches 40.

Implantation Process of Impurities from Front Surface Side

Figure 5:
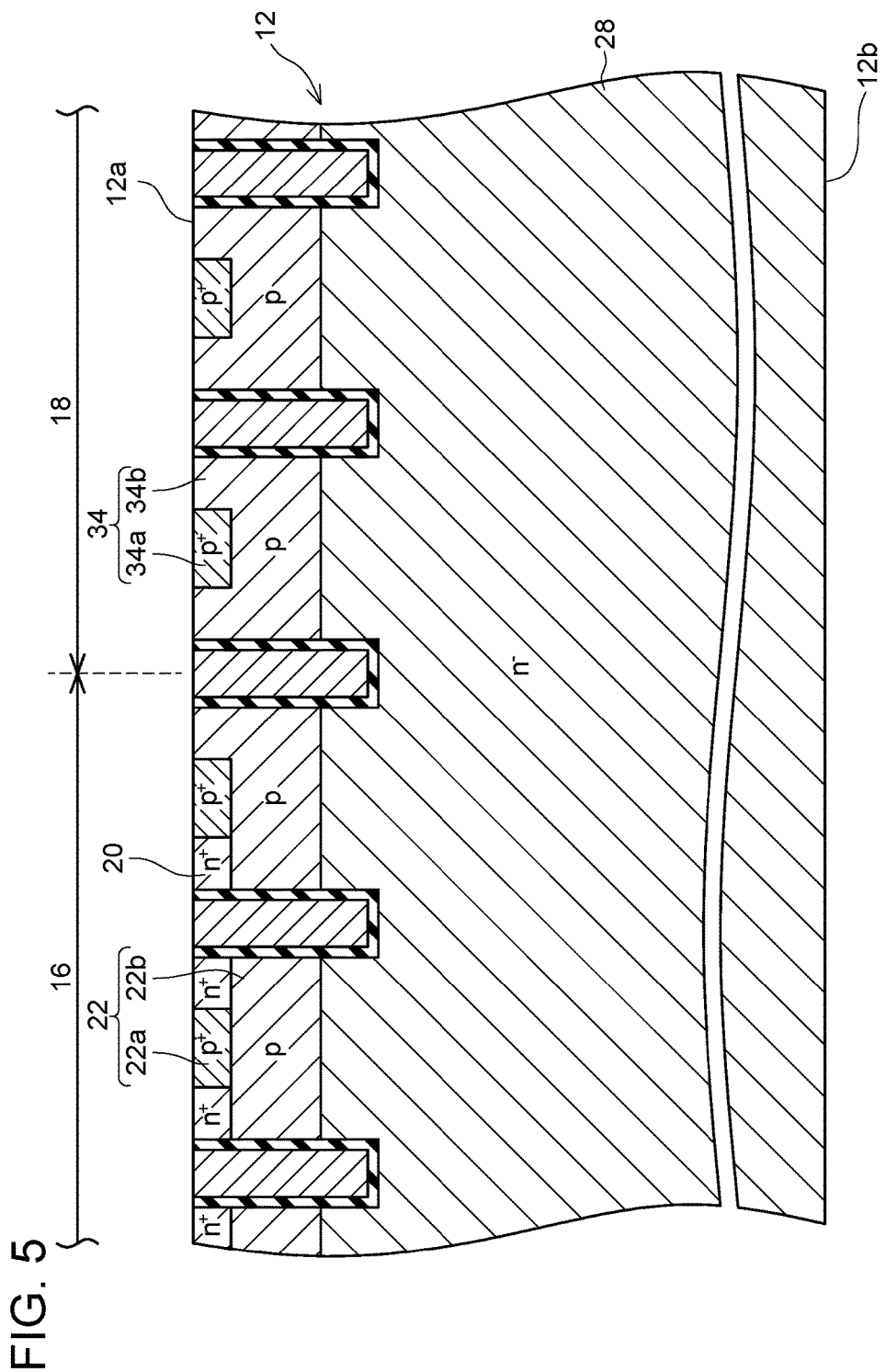
FIG. 5 is a longitudinal sectional view of the semiconductor substrate 12 in which emitter regions 20 and a body region 22 have been formed.

Next, n-type and p-type impurities are selectively implanted into the semiconductor substrate 12 from a front surface 12a side, whereby the body contact regions 22a, the low-density body region 22b, the emitter regions 20, the anode contact regions 34a, and the low-density anode region 34b are formed in the semiconductor substrate 12 as shown in FIG. 5.

First Implantation Process of He Ions

Figure 6:
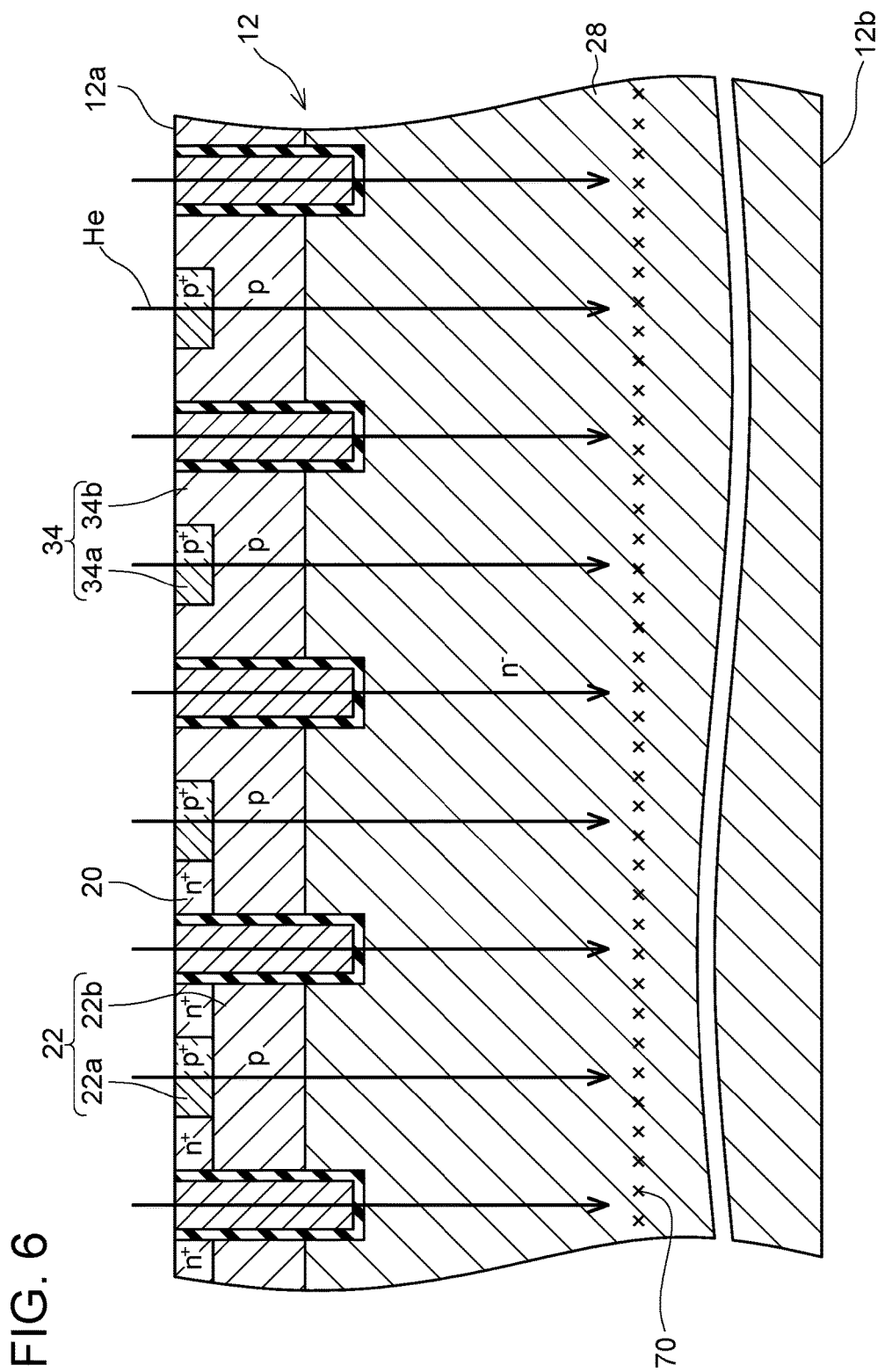
FIG. 6 is an explanatory diagram of first implantation process of He ions.

Next, as shown in FIG. 6, He ions are implanted into the semiconductor substrate 12 from the front surface 12a side. The He ions are implanted into the entirety of the IGBT region 16 and the diode region 18. The He ions implanted into the semiconductor substrate 12 lose its speed in the semiconductor substrate 12 and stop in the semiconductor substrate 12. At this occasion, implantation energy is adjusted so that an average position where the He ions implanted into the semiconductor substrate 12 stop on average is at the same position as the position of a first lifetime control layer 70 in FIG. 1 as viewed from the front surface 12a side of the semiconductor substrate 12. When the He ions stop in the semiconductor substrate 12, a large number of crystal defects are formed near a position where they stop. Therefore, as shown in FIG. 6, the first lifetime control layer 70 in which a crystal defect density is high is formed near the position where the He ions stop. It should be noted that, since at this stage the semiconductor substrate 12 is great in thickness, the first lifetime control layer 70 is positioned closer to the front surface 12a than the intermediate portion of the semiconductor substrate 12 in the thickness direction. Further, also when the He ions move within the semiconductor substrate 12, crystal defects are formed in the semiconductor substrate 12, albeit at a lower density than at the stop position. That is, a small number of crystal defects are also formed in a semiconductor layer serving as a pathway through which the He ions pass (i.e., a semiconductor layer between the first lifetime control layer 70 and the front surface 12a of the semiconductor substrate 12).

Figure 7:
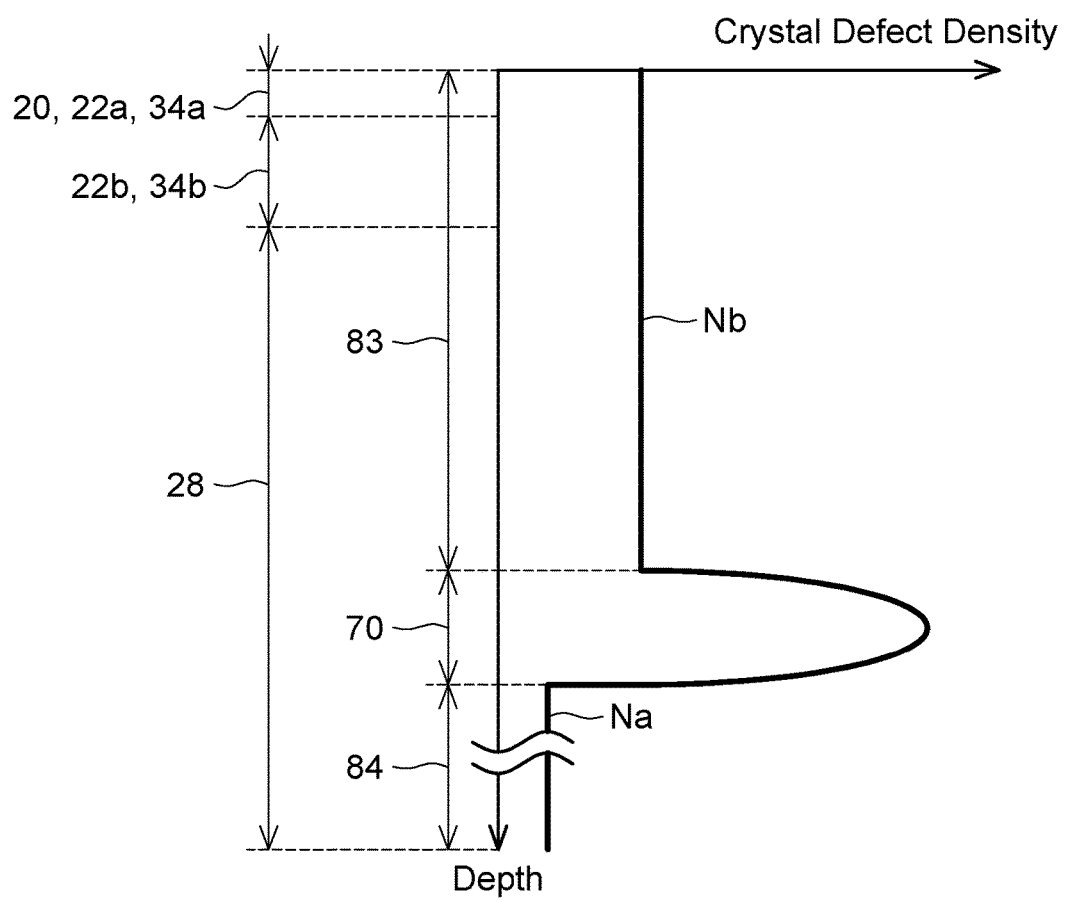
FIG. 7 is a graph showing a distribution of crystal defects at the position of the line A-A after execution of the first implantation process of He ions.

After the first implantation process of He ions, crystal defects are distributed as shown in FIG. 7, as the crystal defects are formed in the semiconductor substrate 12 in the first implantation process of He ions. Since a large number of crystal defects are formed in the first lifetime control layer 70 in the first implantation process of He ions, the crystal defect density is extremely high in the first lifetime control layer 70. In the first lifetime control layer 70, the crystal defect density is distributed in a form of Gaussian distribution where the density has a maximum value.

In the first implantation process of He ions, no crystal defects are formed in the semiconductor layer 84 below the first lifetime control layer 70. Therefore, the crystal defect density in the semiconductor layer 84 does not rise in the first implantation process of He ions. For this reason, the semiconductor layer 84 has a low crystal defect density Na. The crystal defect density Na is substantially equal to the crystal defect density in the unprocessed semiconductor substrate 12.

In the first implantation process of He ions, a semiconductor layer 83 above the first lifetime control layer 70 serves as a pathway through which the He ions pass. For this reason, a small number of crystal defects are formed in the semiconductor layer 83 when the He ions pass. Therefore, a crystal defect density in the semiconductor layer 83 slightly rises in the first implantation of He ions. For this reason, the semiconductor layer 83 has the crystal defect density Nb that is higher than the crystal defect density Na in the semiconductor layer 84 and lower than the crystal defect density in the first lifetime control layer 70.

Second Implantation Process of He Ions

Figure 8:
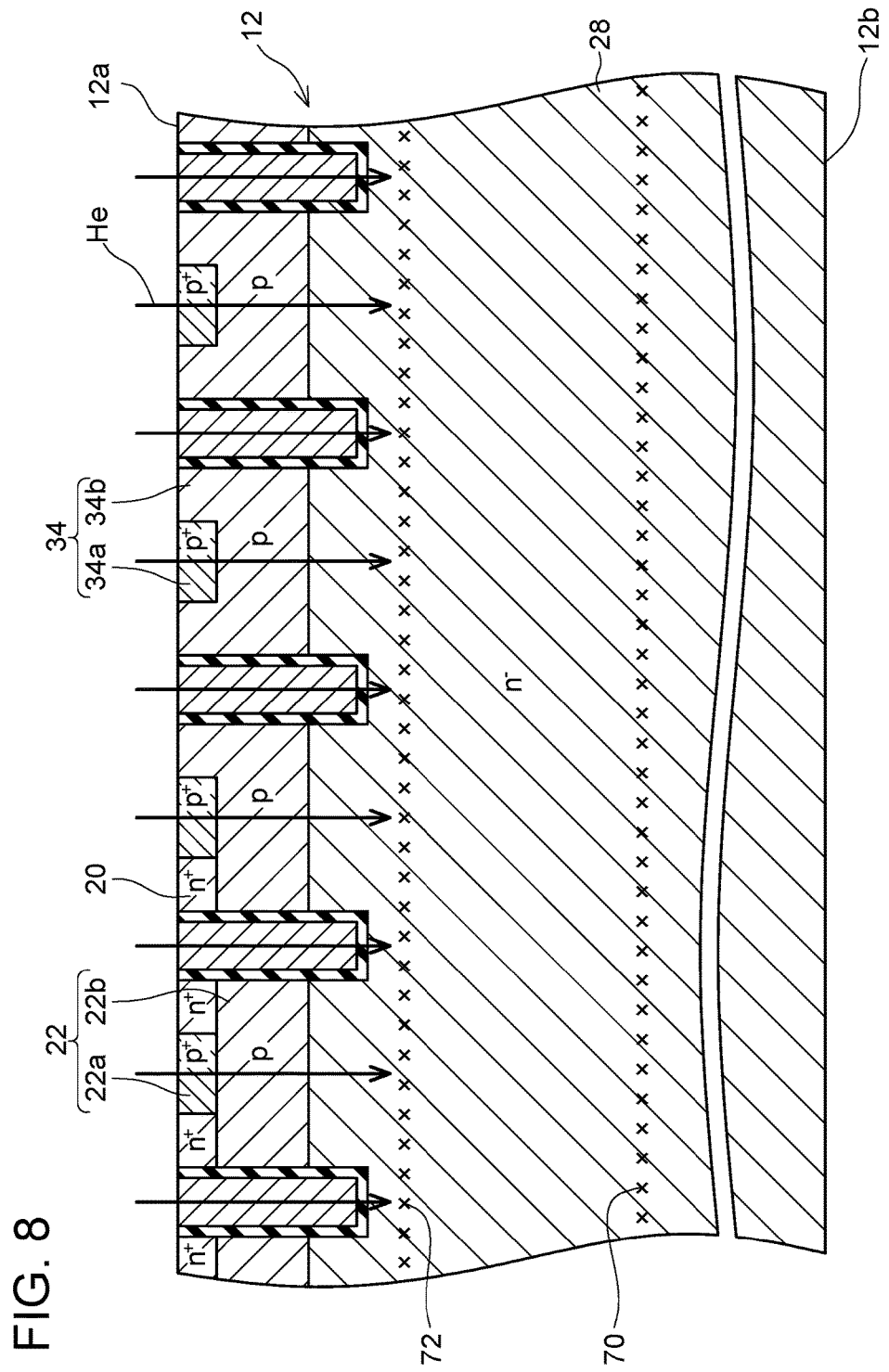
FIG. 8 is an explanatory diagram of second implantation process of He ions.

Next, as shown in FIG. 8, He ions are implanted into the semiconductor substrate 12 from the front surface 12a side. The He ions are implanted into the entirety of the IGBT region 16 and the diode region 18. At this occasion, implantation energy is adjusted so that an average position where the He ions implanted into the semiconductor substrate 12 stop on average is at the same position as the position of the second lifetime control layer 72 as viewed from the front surface 12a side of the semiconductor substrate 12 (i.e., is in a part of the low-density drift region 28 that is located above the first lifetime control layer 70). Therefore, as shown in FIG. 8, the second lifetime control layer 72 in which a crystal defect density is high is formed near the position where the He ions stop. Further, a small number of crystal defects are formed also in a semiconductor layer serving as a pathway through which the He ions pass (i.e., a semiconductor layer between the second lifetime control layer 72 and the front surface 12a of the semiconductor substrate 12).

After the second implantation process of He ions, crystal defects are distributed as shown in FIG. 2, as crystal defects are formed in the semiconductor substrate 12 in the second implantation process of He ions. Since a large number of crystal defects are formed in the second lifetime control layer 72 in the second implantation process of He ions, the crystal defect density is extremely high in the second lifetime control layer 72. In the second lifetime control layer 72, the crystal defect density is distributed in the form of Gaussian distribution where that the density has the maximum value. It should be noted that the crystal defect density in the second lifetime control layer 72 may be higher or lower than the crystal defect density in the first lifetime control layer 70.

In the second implantation of He ions, no crystal defects are formed in the semiconductor layers 82, 70, and 84 below the second lifetime control layer 72. Therefore, the distribution of crystal defect densities in the semiconductor layers 82, 70, and 84 do not change from that shown in FIG. 7.

In the second implantation of He ions, the semiconductor layer 80 that is closer to the front surface 12a than the second lifetime control layer 72 serves as a pathway through which the He ions pass. For this reason, a small number of crystal defects are formed in the semiconductor layer 80 when the He ions pass. Therefore, the crystal defect density in the semiconductor layer 80 slightly rises in the second implantation process of He ions. For this reason, the semiconductor layer 80 has the crystal defect density Nc that is higher than the crystal defect density Nb in the semiconductor layer 82 and lower than the crystal defect density in the second lifetime control layer 72.

Heat Treatment Process

Next, the crystal defects formed in the semiconductor substrate 12 are stabilized by annealing the semiconductor substrate 12 at a temperature of 350° C. to 450° C.

Formation Process of Upper Electrode

Figure 9:
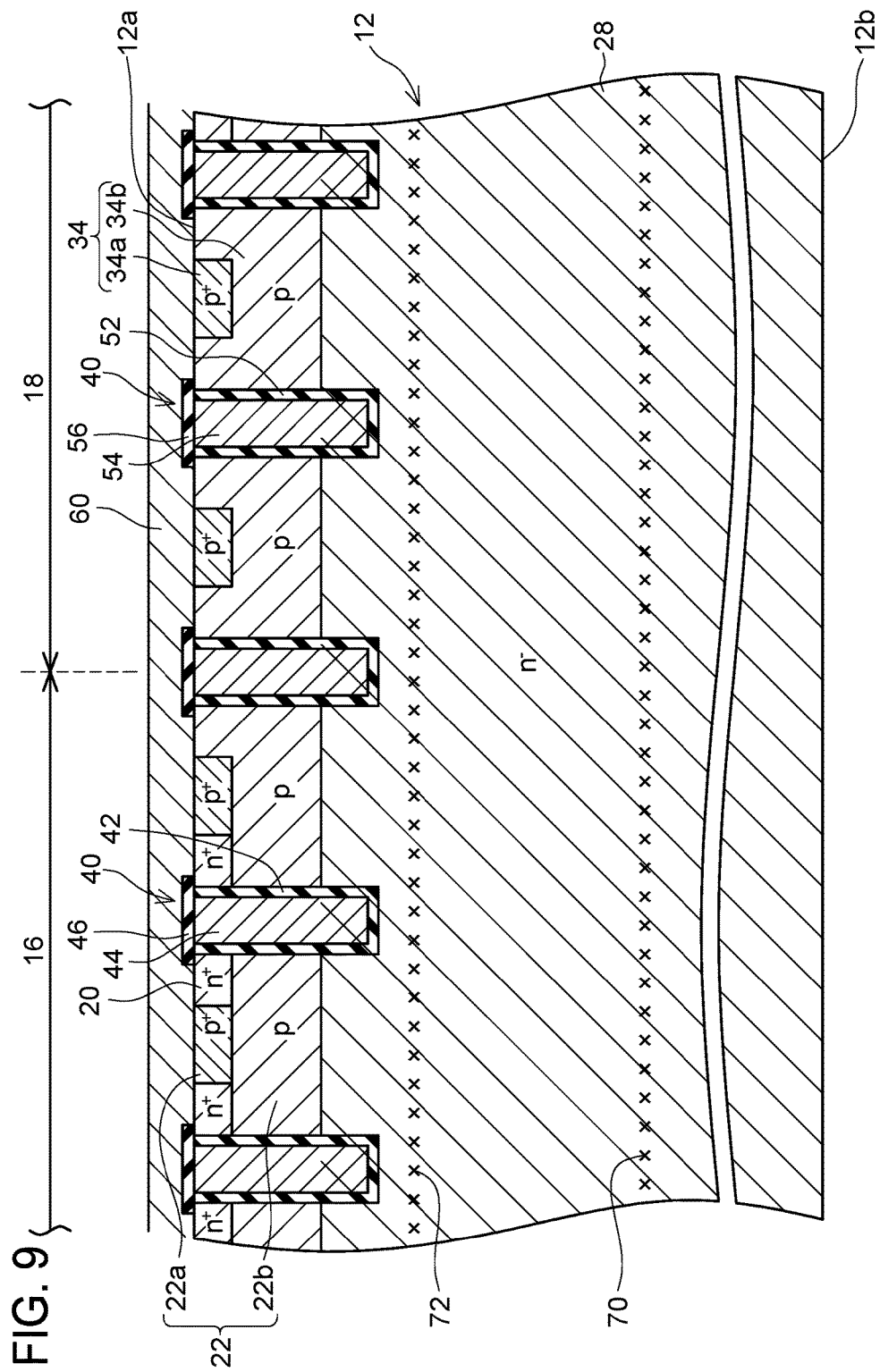
FIG. 9 is a longitudinal sectional view of the semiconductor substrate 12 whose front surface 12a side has been processed.

Next, as shown in FIG. 9, the interlayer insulating films 46 and 56 are formed on the gate electrodes 44 and the control electrodes 54. Next, an upper electrode 60 is formed on the front surface 12a of the semiconductor substrate 12, whereby a structure on the front surface 12a side of the semiconductor device 10 is completed.

Polishing Process of Rear Surface

Next, the semiconductor substrate 12 is thinned by polishing the rear surface 12b of the semiconductor substrate 12. At this occasion, a thickness of the semiconductor substrate 12 is adjusted so that the first lifetime control layer 70 is positioned on the rear surface 12b side with respect to the intermediate portion C1 of the semiconductor substrate 12 in the thickness direction. Further, at this occasion, the thickness of the semiconductor substrate 12 is adjusted so that the semiconductor layer 84 (i.e. the semiconductor layer 84 having the low crystal defect density Na) remains in a range closer to the rear surface 12b than the first lifetime control layer 70.

Processing Process of Rear Surface Side

Next, the buffer region 30, the collector region 32, and the cathode region 36 are formed by implanting p-type and n-type impurities into the semiconductor substrate 12 from the rear surface 12b side. After that, the lower electrode 62 is formed on the rear surface 12b of the semiconductor substrate 12, whereby the semiconductor device shown in FIG. 1 is completed.

In this manufacturing method, He ions are implanted into the semiconductor substrate 12 from the front surface 12a side in the first implantation process of He ions and the second implantation process of He ions. This manufacturing method does not include a process of implanting He ions into the semiconductor substrate 12 from the rear surface 12b side. Therefore, the crystal defect density in the semiconductor layer 84 in the range closer to the rear surface 12b than the first lifetime control layer 70 can be kept at a low density. That is, the crystal defect density in the collector region 32 and the buffer region 30 can be lowered. Therefore, this manufacturing method can suppress the occurrence of variations in the on-state voltages and switching losses of the IGBTs among semiconductor devices 10 that are manufactured.

It should be noted that the embodiment described above has dealt with an RC-IGBT. However, the technology disclosed herein may be applied to a single IGBT.

Further, in the semiconductor device 10 according to the embodiment described above, the drift region 26 includes the buffer region 30. However, the drift region 26 may not need to include the buffer region 30. Further, without the formation of the second lifetime control layer 72, only the first lifetime control layer 70 may be formed. Such a configuration, too, can reduce the turn-off loss of the IGBT.

Further, in the manufacturing method according to the embodiment described above, the lifetime control layers are formed by implanting He ions. Alternatively, the lifetime control layers may be formed by implanting other charged particles (e.g., hydrogen ions) that do not function as donors or acceptors in the semiconductor substrate.

The following enumerates some technical elements disclosed herein. It should be noted that the following technical elements are each independently useful.

In a semiconductor device disclosed herein as an example, a second lifetime control layer extending along the planar direction of the semiconductor substrate may be provided in a range in the drift region that is closer to the front surface than the first lifetime control layer. A crystal defect density in the second first lifetime control layer may be higher than any of a crystal defect density in a region adjacent to the second lifetime control layer on the rear surface side and a crystal defect density in a region adjacent to the second lifetime control layer on the front surface side By thus providing the two lifetime control layers in the drift region, the turn-off loss of the IGBT can be further reduced.

In a semiconductor device disclosed herein as an example, the drift region may comprise a low density drift region; and a buffer region located between the low density drift region and the collector region and including an n-type impurity density ten or more times higher than an n-type impurity density in the low density drift region. The first lifetime control layer may be provided in the low density drift region.

Such formation of the first lifetime control layer in the low-density drift region makes it possible to further reduce the turn-off loss of the IGBT more effectively.

In a semiconductor device disclosed herein as an example, the semiconductor substrate may comprise a diode region. The diode region may comprise an anode region being of p-type and exposed on the front surface. The drift region may be in contact with the anode region and exposed on the rear surface in the diode region. The first lifetime control layer may be distributed across the IGBT region and the diode region.

This configuration makes it possible to reduce a loss during a reverse recovery operation of the diode.

A method of manufacturing a semiconductor device disclosed herein as an example may further comprise polishing the rear surface so as to thin the semiconductor substrate after the formation of the first lifetime control layer so that a semiconductor layer remains in the range closer to the rear surface than the first lifetime control layer. The collector region may be formed in the semiconductor layer remaining in the range closer to the rear surface than the first lifetime control layer in the formation of the collector region.

A method of manufacturing a semiconductor device disclosed herein as an example may comprise implanting charged particles into the semiconductor substrate from the front surface side so as to form a second lifetime control layer in which a crystal defect density is increased, the second lifetime control layer being formed in a range in the drift region a is closer to the front surface than the first lifetime control layer.

It should be noted that either the second lifetime control layer or the first lifetime control layer may be formed earlier than the other, or they may be formed at the same time.

This configuration makes it possible to provide the two lifetime control layers in the drift region. The turn-off loss of the IGBT can be further reduced.

A method of manufacturing a semiconductor device disclosed herein as an example may comprise forming a buffer region in a range in the drift region that is closer to the rear surface than the first lifetime control layer, wherein the buffer region includes an n-type impurity density ten or more times higher than an n-type impurity density in the original drift region.

When the first lifetime control layer is thus located closer to the front surface than the buffer region, the turn-off loss of the IGBT can be further reduced more effectively.

A method of manufacturing a semiconductor device disclosed herein as an example may comprise forming an anode region being of p-type in a range in the semiconductor substrate that is closer to the front surface than the first lifetime control layer so that the anode region is exposed on the front surface, the drift region is in contact with the anode region, and the drift region is exposed on the rear surface at a position on the rear surface side with respect to the anode region.

This configuration makes it possible to reduce a loss during a reverse recovery operation of the diode.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device, comprising a semiconductor substrate that includes an IGBT region,
wherein
the semiconductor substrate includes a front surface and a rear surface,
the IGBT region comprises:
an emitter region being of n-type and exposed on the front surface;
a body region being of p-type and in contact with the emitter region;
a drift region being of n-type, located on a rear surface side with respect to the body region, and separated from the emitter region by the body region; and a collector region being of p-type, located on the rear surface side with respect to the drift region, separated from the body region by the drift region, and exposed on the rear surface, a gate electrode is located so as to face, via a gate insulating film, a part of the body region in a range separating the emitter region from the drift region, a first lifetime control layer extending along a planar direction of the semiconductor substrate is provided in a range in the drift region that is closer to the rear surface than an intermediate portion of the semiconductor substrate in a thickness direction of the semiconductor substrate, a crystal defect density in the first lifetime control layer is higher than any of a crystal defect density in a region adjacent to the first lifetime control layer on the rear surface side and a crystal defect density in a region adjacent to the first lifetime control layer on a front surface side, a crystal defect density in a region between the first lifetime control layer and the rear surface is lower than a crystal defect density in a region between the first lifetime control layer and the front surface, a second lifetime control layer extending along the planar direction of the semiconductor substrate is provided in a range in the drift region that is closer to the front surface than the first lifetime control layer, and a crystal defect density in the second lifetime control layer is higher than any of a crystal defect density in a region adjacent to the second lifetime control layer on the rear surface side and a crystal defect density in a region adjacent to the second lifetime control layer on the front surface side.

2. The semiconductor device of claim 1, wherein
the drift region comprises:
  a low density drift region; and
  a buffer region located between the low density drift region and the collector region and including an n-type impurity density ten or more times higher than an n-type impurity density in the low density drift region, and
the first lifetime control layer is provided in the low density drift region.

3. The semiconductor device of claim 1, wherein
the semiconductor substrate comprises a diode region, and
the diode region comprises an anode region being of p-type and exposed on the front surface,
the drift region is in contact with the anode region and exposed on the rear surface in the diode region, and
the first lifetime control layer is distributed across the IGBT region and the diode region.

4. A method for manufacturing a semiconductor device, the method comprising:
  implanting charged particles into a semiconductor substrate comprising an n-type drift region so as to form a first lifetime control layer in the n-type drift region, wherein the semiconductor substrate includes a front surface and a rear surface, the charged particles are implanted from a front surface side, and a crystal defect density is increased in the first lifetime control layer;
  forming an emitter region, a body region, and a gate electrode in a range closer to the front surface than the first lifetime control layer;
  forming a collector region in a range closer to the rear surface than the first lifetime control layer; and
  polishing the rear surface so as to thin the semiconductor substrate after the formation of the first lifetime control layer so that a semiconductor layer remains in the range closer to the rear surface than the first lifetime control layer,
wherein
the emitter region is of n-type and exposed on the front surface,
the body region is of p-type, is in contact with the emitter region, and separates the emitter region from the n-type drift region,
the gate electrode faces, via a gate insulating film, a part of the body region in a range separating the emitter region from the n-type drift region,
the collector region is of p-type, located on a rear surface side with respect to the n-type drift region, separated from the body region by the n-type drift region, and exposed on the rear surface,
the first lifetime control layer is located in a range closer to the rear surface than an intermediate portion of the semiconductor substrate in a thickness direction of the semiconductor substrate, and
the collector region is formed in the semiconductor layer remaining in the range closer to the rear surface than the first lifetime control layer in the formation of the collector region.

5. The method of claim 4, further comprising implanting charged particles into the semiconductor substrate from the front surface side so as to form a second lifetime control layer in which a crystal defect density is increased, the second lifetime control layer being formed in a range in the n-type drift region that is closer to the front surface than the first lifetime control layer.

6. The method of claim 4, further comprising forming a buffer region in a range in the n-type drift region that is closer to the rear surface than the first lifetime control layer, wherein the buffer region includes an n-type impurity density ten or more times higher than an n-type impurity density in the original n-type drift region.

7. The method of claim 4, further comprising forming an anode region being of p-type in a range in the semiconductor substrate that is closer to the front surface than the first lifetime control layer so that the anode region is exposed on the front surface, the n-type drift region is in contact with the anode region, and the n-type drift region is exposed on the rear surface at a position on the rear surface side with respect to the anode region.

8. A semiconductor device, comprising a semiconductor substrate that includes an IGBT region,
wherein
the semiconductor substrate includes a front surface and a rear surface,
the IGBT region comprises:
  an emitter region being of n-type and exposed on the front surface;
  a body region being of p-type and in contact with the emitter region;
  a drift region being of n-type, located on a rear surface side with respect to the body region, and separated from the emitter region by the body region; and
  a collector region being of p-type, located on the rear surface side with respect to the drift region, separated from the body region by the drift region, and exposed on the rear surface,
a gate electrode is located so as to face, via a gate insulating film, a part of the body region in a range separating the emitter region from the drift region, a first lifetime control layer extending along a planar direction of the semiconductor substrate is provided in a range in the drift region that is closer to the rear surface than an intermediate portion of the semiconductor substrate in a thickness direction of the semiconductor substrate, a crystal defect density in the first lifetime control layer is higher than any of a crystal defect density in a region adjacent to the first lifetime control layer on the rear surface side and a crystal defect density in a region adjacent to the first lifetime control layer on a front surface side, a crystal defect density in a region between the first lifetime control layer and the rear surface is lower than a crystal defect density in a region between the first lifetime control layer and the front surface, the drift region comprises:

a low density drift region; and a buffer region located between the low density drift region and the collector region and including an n-type impurity density ten or more times higher than an n-type impurity density in the low density drift region, and the first lifetime control layer is provided in the low density drift region.

9. The semiconductor device of claim 8, wherein the semiconductor substrate comprises a diode region, and the diode region comprises an anode region being of p-type and exposed on the front surface, the drift region is in contact with the anode region and exposed on the rear surface in the diode region, and the first lifetime control layer is distributed across the IGBT region and the diode region.

\* \* \* \* \*